(12) United States Patent
Zhao et al.

(10) Patent No.: US 10,991,554 B2
(45) Date of Patent: Apr. 27, 2021

(54) PLASMA PROCESSING SYSTEM WITH SYNCHRONIZED SIGNAL MODULATION

(71) Applicant: Tokyo Electron Limited, Tokyo (JP)

(72) Inventors: Jianping Zhao, Austin, TX (US); Peter L. G. Ventzek, Austin, TX (US); Barton Lane, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 131 days.

(21) Appl. No.: 16/138,375

(22) Filed: Sep. 21, 2018

(65) Prior Publication Data

US 2019/0148113 A1   May 16, 2019

Related U.S. Application Data

(60) Provisional application No. 62/587,418, filed on Nov. 16, 2017.

(51) Int. Cl.
*H01J 37/32* (2006.01)
*H01L 21/67* (2006.01)

(52) U.S. Cl.
CPC .. *H01J 37/32165* (2013.01); *H01J 37/32128* (2013.01); *H01J 37/32146* (2013.01); *H01J 37/32568* (2013.01); *H01J 37/32715* (2013.01); *H01L 21/67253* (2013.01); *H01J 2237/3341* (2013.01)

(58) Field of Classification Search
CPC ........... H01J 37/32091; H01J 37/32146; H01J 37/32165; H01J 37/32183; H01J 37/32935; H01J 2237/334; H01J 37/32082; H01J 37/321; H01J 37/32174
See application file for complete search history.

(56) References Cited

U.S. PATENT DOCUMENTS

| 2008/0023443 | A1 | 1/2008 | Paterson et al. | |
| 2009/0255800 | A1* | 10/2009 | Koshimizu | H01J 37/32165 204/164 |
| 2010/0062613 | A1* | 3/2010 | Kim | H01L 21/31608 438/778 |

(Continued)

OTHER PUBLICATIONS

Korean Intellectual Property Office, International Search Report and Written Opinion for International application No. PCT/US2018/052223 dated Jan. 18, 2019, 13 pages.

*Primary Examiner* — Wei (Victor) Y Chan
(74) *Attorney, Agent, or Firm* — Slater Matsil, LLP

(57) ABSTRACT

A system and method for using plasma to treat a substrate are described. The system includes a substrate holder disposed within a plasma processing system, and arranged to support a substrate, a first signal generator for coupling a first signal at a first frequency to plasma in the plasma processing system, and a second signal generator for coupling a second signal at a second frequency to plasma in the plasma processing system, wherein the second frequency being less than the first frequency. The system further includes an amplitude modulation circuit for modulating the first signal between a high amplitude state and a low amplitude state in response to an amplitude modulation signal, and a timing circuit configured to define the amplitude modulation signal that synchronizes the amplitude modulation of the first signal with a target phase for each cycle of the second signal.

20 Claims, 6 Drawing Sheets

(56) References Cited

U.S. PATENT DOCUMENTS

| | | | |
|---|---|---|---|
| 2011/0070665 A1* | 3/2011 | Chen | H01J 37/32935 |
| | | | 438/5 |
| 2012/0031560 A1* | 2/2012 | Koshimizu | H01J 37/32623 |
| | | | 156/345.33 |
| 2012/0283973 A1 | 11/2012 | Samara et al. | |
| 2016/0071701 A1 | 3/2016 | Lane | |
| 2017/0084432 A1* | 3/2017 | Valcore, Jr. | H01J 37/32449 |
| 2017/0098527 A1* | 4/2017 | Kawasaki | H01J 37/32165 |
| 2018/0005802 A1* | 1/2018 | Chen | H01J 37/32082 |
| 2018/0342903 A1* | 11/2018 | Luu | H02J 50/20 |

* cited by examiner

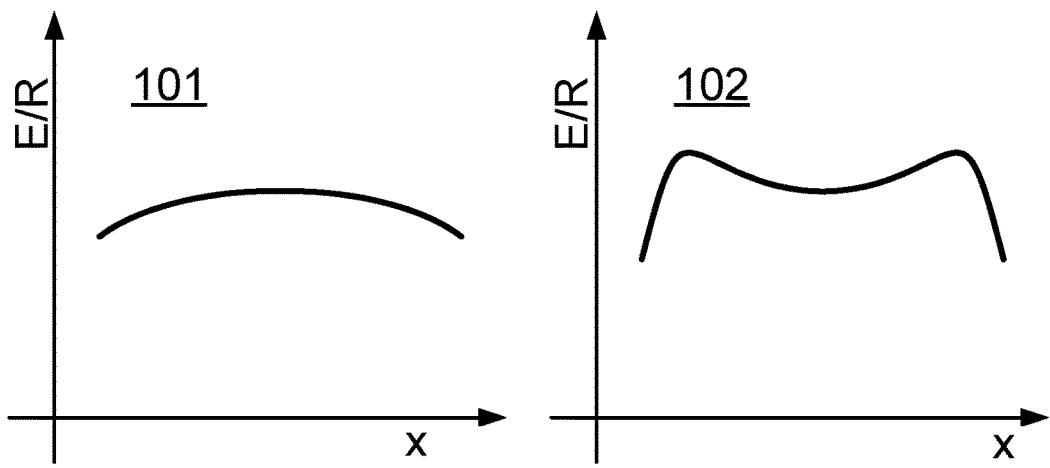
FIG. 1
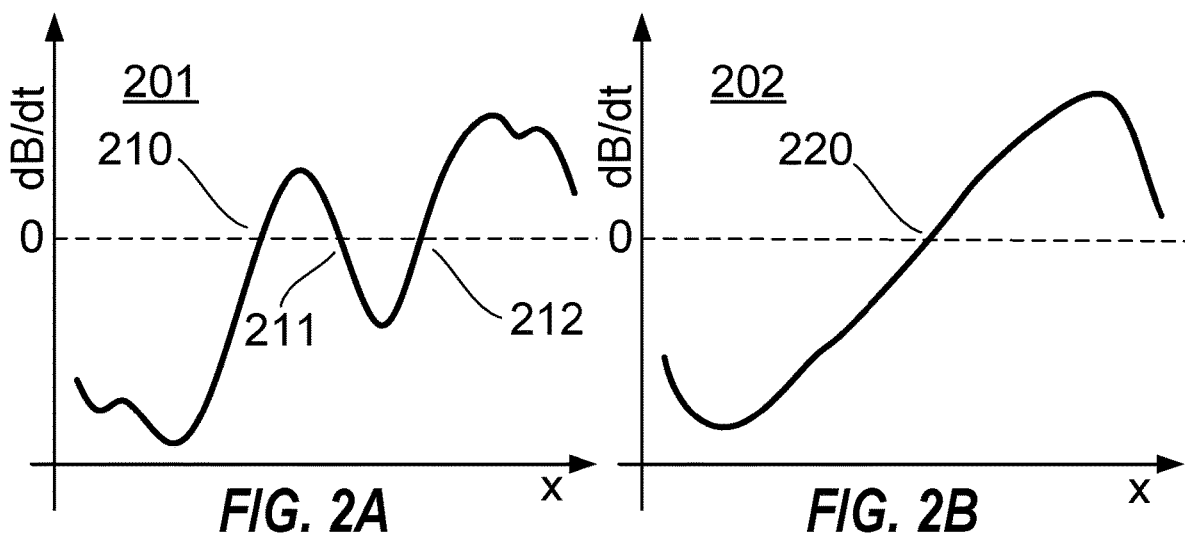
FIG. 2A
FIG. 2B
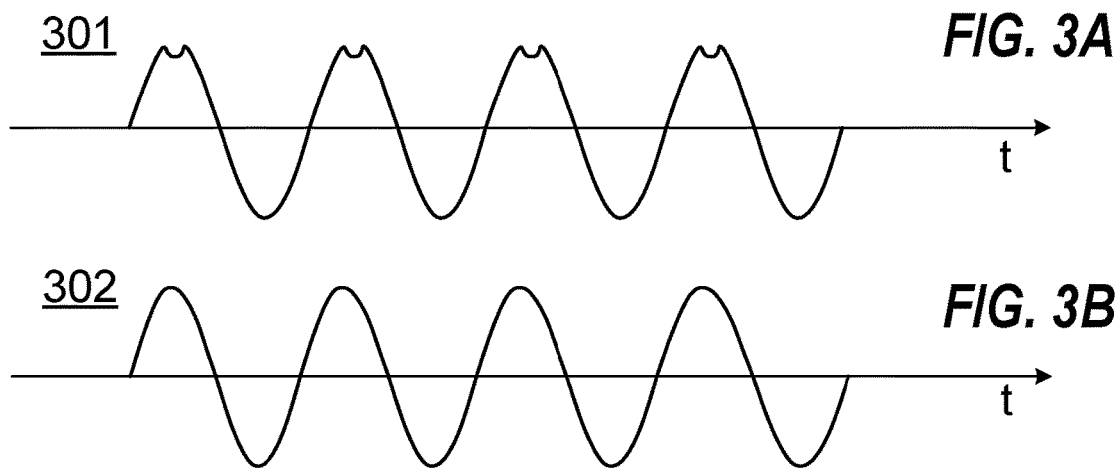
FIG. 3A
FIG. 3B

PLASMA PROCESSING SYSTEM WITH SYNCHRONIZED SIGNAL MODULATION

CROSS REFERENCE TO RELATED APPLICATIONS

This application claims priority to U.S. Provisional Application No. 62/587,418 entitled "PLASMA PROCESSING SYSTEM WITH SYNCHRONIZED SIGNAL MODULATION" filed on Nov. 16, 2017, which is incorporated herein by reference in its entirety.

FIELD OF INVENTION

The invention relates to a system and method for plasma processing, and more particularly, a plasma processing technique for etching or depositing a thin film for electronic device applications.

BACKGROUND OF THE INVENTION

Plasma processing is a standard technique used to manufacture semiconductor integrated circuitry by assisting the depositing or etching of material to and from a workpiece. In the reactor design for both etch and deposition applications, an important requirement is to achieve acceptable metrics, such as etch rate, deposition rate, etc., and the spatial uniformity thereof, in order to meet yield requirements. Spatial uniformity is easier to achieve if the plasma density is known to be uniform across the substrate from center to edge. In many situations, it is desirable to use plasma generated at an RF (radio frequency) frequency in the VHF (very high frequency) range (30-300 MHz), as opposed to 13.56 MHz that has been a standard RF frequency for producing plasma in semiconductor processing.

Some advantages of higher frequency include plasma generation efficiency to achieve higher plasma density. The RF voltage of the plasma sheath is also smaller, leading to lower ion energies and less bombardment of the chamber walls and substrate where sputtering and damage are considerations. These advantages are particularly useful for next generation etching requirements.

High density plasma is of particular use to dissociate the primary molecules in a deposition application. It has been found experimentally however that plasmas generated by VHF generally have non-uniform radial profiles. In the case of 100 MHz plasmas this can be quite pronounced with a sharp center peak in the plasma density. It is also the case that often processes require a mixture of high frequency and low frequency RF. The low frequency RF power provides higher ion energies. It has been found that the addition of low frequency RF power to high frequency RF power changes the plasma density profiles in ways which are unexpected and vary from application to application.

SUMMARY

Techniques herein pertain to device fabrication using plasma processing techniques.

In one embodiment, a system for using plasma to treat a substrate is described. The system includes a substrate holder disposed within a plasma processing system, and arranged to support a substrate, a first signal generator for coupling a first signal at a first frequency to plasma in the plasma processing system, and a second signal generator for coupling a second signal at a second frequency to plasma in the plasma processing system, wherein the second frequency being less than the first frequency. The system further includes an amplitude modulation circuit for modulating the first signal between a high amplitude state and a low amplitude state in response to an amplitude modulation signal, and a timing circuit configured to define the amplitude modulation signal that synchronizes the amplitude modulation of the first signal with a target phase for each cycle of the second signal.

In another embodiment, a method for using plasma to treat a substrate is described. The method includes placing a substrate on a substrate holder disposed within a plasma processing system; applying a first signal to plasma formed in the plasma processing system using a first signal generator at a first frequency; applying a second signal to plasma formed in the plasma processing system using a second signal generator at a second, the second frequency being less than the first frequency; using an amplitude modulation circuit, modulating the first signal between a high amplitude state and a low amplitude state in response to an amplitude modulation signal; and controlling a duration of optimal coupling of the first signal relative to the second signal to the plasma to achieve a target spatial distribution of the plasma.

In yet another embodiment, a system for using plasma to treat a substrate is described. The system includes: a substrate holder disposed within a plasma processing system, and arranged to support a substrate; a first signal generator for coupling a first signal at a first frequency to plasma in the plasma processing system; a second signal generator for coupling a second signal at a second frequency to plasma in the plasma processing system, the second frequency being less than the first frequency; and a waveform generator coupled to the second signal generator, and configured to adjust a waveform of the second signal and a duty cycle thereof, and control a duration for optimal coupling of the first signal relative to the second signal to the plasma.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

In the accompanying drawings:

FIG. 1 illustrates a schematic representation of a plasma state according to an embodiment;

FIGS. 2A and 2B provide exemplary measurement data supporting a plasma state according to an embodiment;

FIGS. 3A and 3B provide additional exemplary measurement data supporting a plasma state according to an embodiment;

DETAILED DESCRIPTION

Figure 4A:
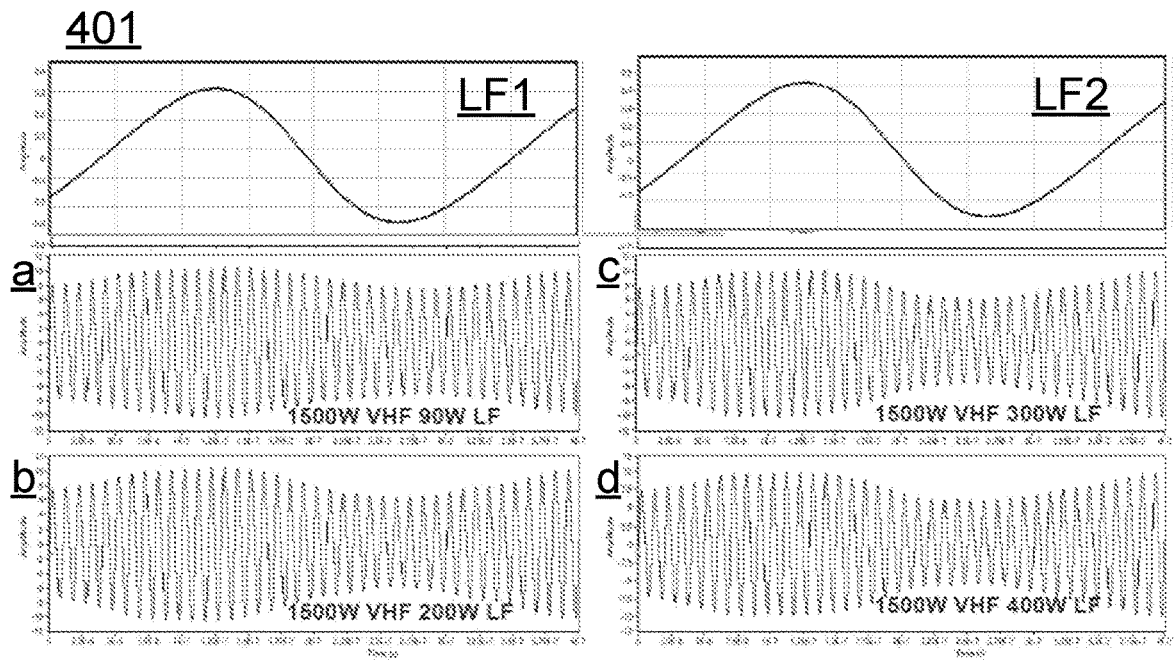
FIGS. 4A and 4B provide yet additional exemplary measurement data supporting a plasma state according to an embodiment.

Techniques herein pertain to device fabrication using plasma processing systems and methods. Several instances manifest in semiconductor manufacturing in both front end of line (FEOL, e.g., transistor fabrication) through to the back end of line (BEOL, e.g., interconnect fabrication), where uniform processing is important for device yield. Described herein are systems and methods for modifying a plasma state, including spatial distributions of plasma properties, as well as systems and methods for employing measured signals, which may be used to control the density profile.

As an example, at frequencies of approximately 60 MHz or greater, the wavelength of electromagnetic wave propagation launched by the RF (radio frequency) system within the plasma reactor becomes comparable to the chamber size and electromagnetic effects become important. The electric fields change from the low frequency electrostatic fields to propagating and standing waves. Depending on process conditions, e.g., power, pressure, gas chemistry, etc., and the plasma property being measured, plasma property distribution, and the resultant etch or deposition rate can vary across a substrate or workpiece. As shown in FIG. 1, etch (or deposition) rate (E/R) can have a 'center-high' distribution 101, or an 'edge-high' distribution 102, in some situations. And, it may be desirable to achieve uniform conditions, or spatial uniformity within predetermined specifications, i.e., acceptable or target degree of spatial variability.

The wave-like nature at VHF frequencies, e.g., 100 MHz, has been assessed using a magnetic field probe to measure, e.g., dB/dt (where B represents the magnetic field and t is time) for different plasma states, such as non-uniform plasma states depicted in FIG. 1, or uniform plasma states (not shown). As shown in FIGS. 2A and 2B, magnetic field probe measurements are performed as a function of spatial location (x) across a substrate. FIG. 2A provides an exemplary spatial measurement of the time rate-of-change of the B-field that correlates with a non-uniform plasma state (201), having multiple zero crossings 210, 211, 212. Conversely, FIG. 2B, provides an exemplary spatial measurement of the time rate-of-change of the B-field that correlates with a uniform plasma state (202), having a single zero crossings 220. Moreover, FIG. 3 provide exemplary magnetic field probe measurements as a function of time (t). The time traces of dB/dt, 301 and 302, are substantially sinusoidal, with the exception of time trace 301 that exhibits a variation in the signal peak in the positive phase of the trace. This behavior is representative of the spatial characteristics of distribution 201 in FIG. 2A, while the behavior of trace 302 is representative of the spatial characteristics of distribution 202 in FIG. 2B.

The inventors surmise that the presence of non-linear behavior scales with pressure and plasma density (e.g., coupled power), among other parameters, in a manner associated with plasma sheath dynamics and surface wave generation. Moreover, non-linear phenomena near the plasma center can lead to transient behavior on time scales of nanoseconds, considerably shorter than the wave period of 10 ns. This transient behavior can concentrate within a small portion of the 100 MHz phase and its occurrence can correlate with the peaking of the density profile. The inventors have conducted similar experiments with a multi-frequency system, e.g., two frequencies, driving the plasma at a relatively low frequency and a relatively high frequency. It was found that the rapid non-linear transients only occurred during a particular phase of the low frequency oscillation. Separately it was found that if the 100 MHz was amplitude modulated at particular phases of the low frequency RF, that the density could be strongly modified if the 100 MHz had an envelope which had a maximum at a particular phase of the low frequency RF.

Figure 4B:
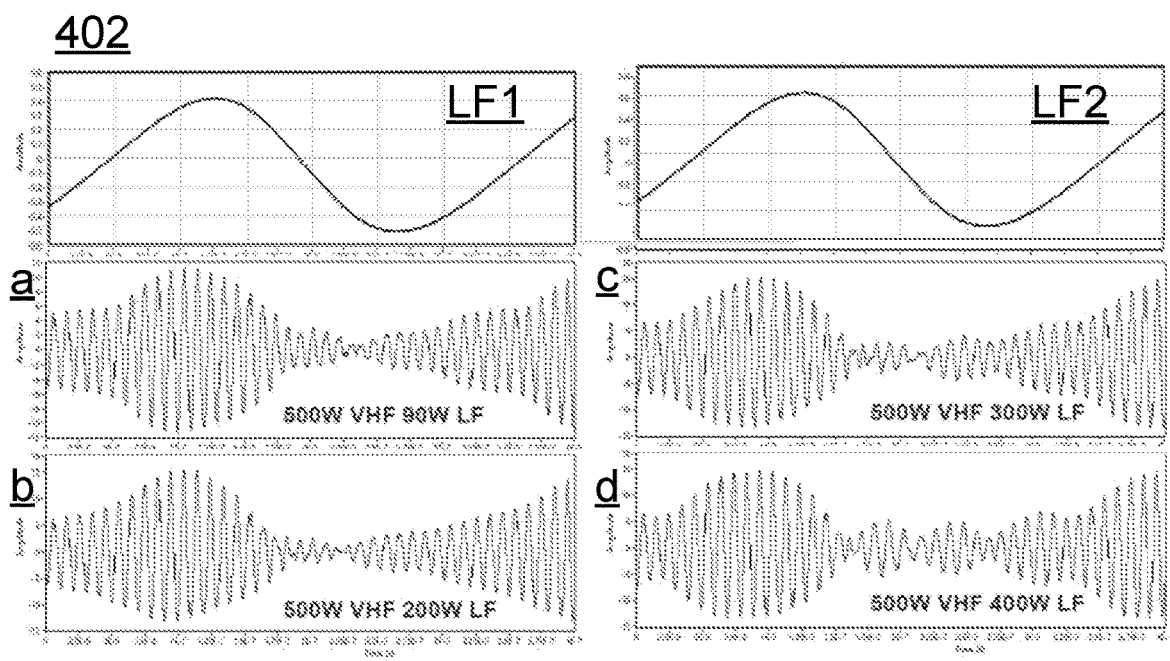
Figure 7:
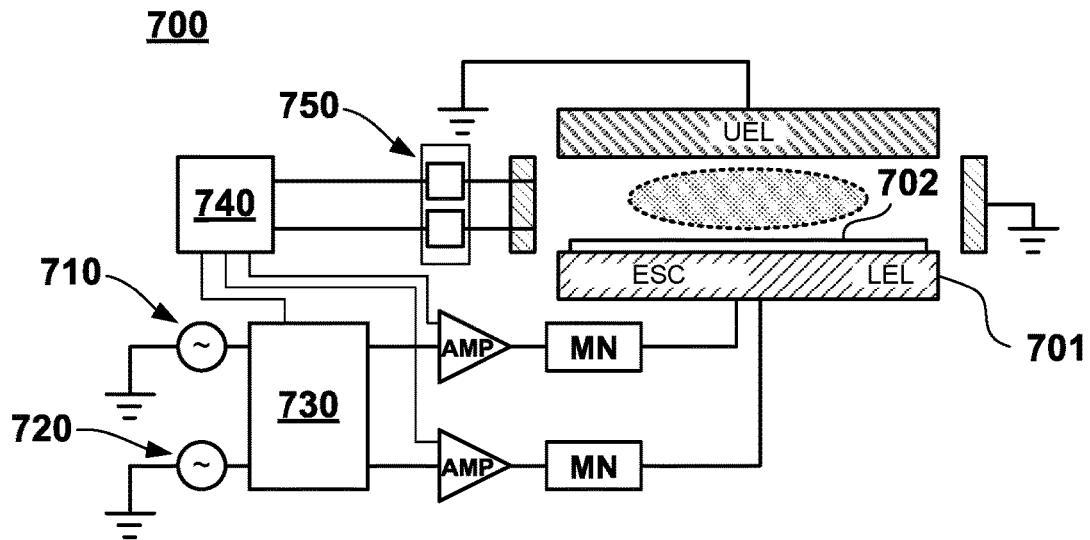
FIG. 7 provides a schematic illustration of a system for plasma processing according to an embodiment.

Turning to FIGS. 4A and 4B, time traces (a through d) for data sets 401 and 402 are presented for data collected on a multi-frequency, plasma processing system, similar to the system depicted in FIG. 7. The multi-frequency system operates a first signal generator for coupling a first signal at a first frequency, e.g., 100 MHz (VHF power), and a second signal generator for coupling a second signal at a second frequency, e.g., 3.2 MHz (LF power). Each data set, 401 and 402, includes a LF time trace, LF1 and LF2, for one LF period, and four (4) VHF time traces, 'a' through 'd', for VHF content during one LF period. As shown in FIG. 4A, data set 401 exhibits weak VHF modulation in traces 'a' through 'd' for variations in LF power (i.e., 90 W to 400 W), due in part to a relatively high electron density (e.g., high VHF power). However, as shown in FIG. 4B, data set 402 exhibits strong VHF modulation in traces 'a' through 'd' for variations in LF power (i.e., 90 W to 400 W), due in part to a relatively high pressure and low electron density The inventors have observed that the low frequency RF (LF) changes the shape of the plasma on a low frequency time scale, and as the plasma shape changes, the propagation of the 100 MHz electromagnetic wave is affected. Since the 100 MHz wave propagation drives ionization, maximizing the envelope of the 100 MHz wave propagation at a specific phase or phase range of the low frequency signal leads to changes in the density profile. As a result of this insight, systems and methods are proposed for modifying plasma properties, including a spatial distribution of the processing plasma. The inventors surmise the effect of the low frequency RF is to move electrons in the plasma such that sheaths between the plasma and various walls of the reactor either expand or contract. This expansion or contraction is naturally periodic with the low frequency RF frequency (LF). The propagation and wave structure of the high frequency RF (VHF) depends on the nature of the sheath, and during specific sheath configurations, the high frequency signal couples more efficiently to the plasma via non-linear interaction to produce density profiles different than the density profile achieved via other sheath configurations.

Figure 5A:
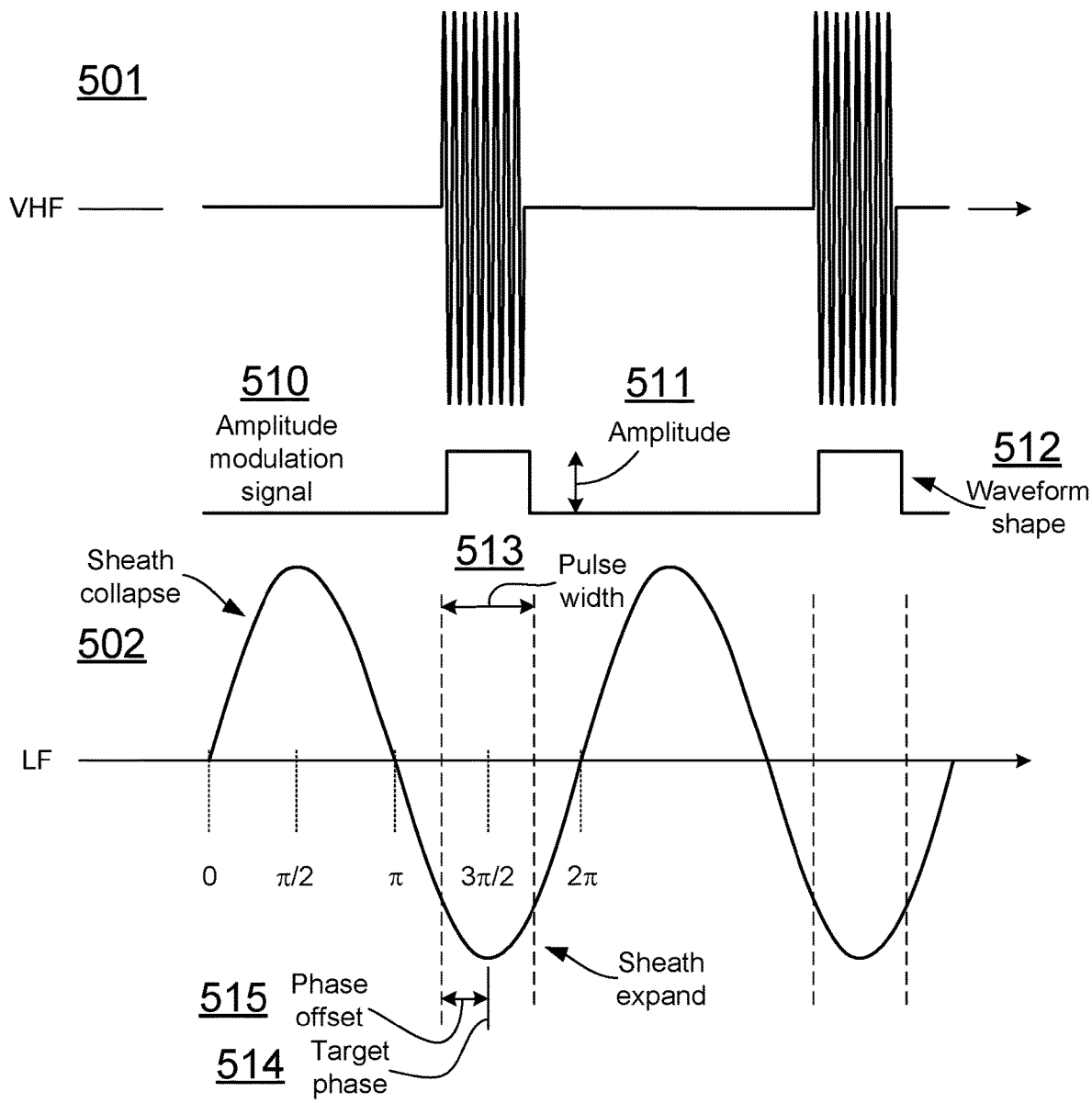
FIGS. 5A and 5B illustrate a method for plasma processing according to an embodiment.

According to one embodiment, a first signal, e.g., high frequency RF (VHF), can be coupled during a target phase of a second signal, e.g., low frequency RF (LF). For example, the application of the high frequency RF is localized to a specific sheath configuration. As shown in FIG. 5A, a first signal 501 at a first frequency (e.g., VHF) and a second signal 502 at a second frequency (e.g., LF) are coupled to a plasma, and the VHF amplitude is increased during plasma sheath expansion. The second signal 502, i.e., the low frequency waveform, can be composed of a single sinusoidal waveform, and the first signal 501, i.e., the high frequency waveform, can be composed of a sinusoidal waveform that is amplitude modulated, and localized at a particular phase of the second signal 502. In other embodiments, the second signal 502 is non-sinusoidal. For example, at a particular instantaneous low frequency RF voltage, the sheath configuration may be optimal for uniform high frequency wave propagation. The low frequency waveform can be shaped, such that this particular RF voltage occurs for a longer portion of the low frequency RF cycle. In this case the maximum of the high frequency RF envelope can be allowed to expand in duration and occupy the portion of the low frequency cycle which is optimal.

According to various embodiments, the amplitude of the first signal 501 is modulated according to an amplitude modulation signal 510. The amplitude modulation signal 510 can be characterized by an amplitude 511, and a waveform shape 512, either of which may or may not vary in time. FIG. 5A depicts a square wave, yet the waveform shape can include a sinusoid, saw-tooth, or any arbitrary shape. The amplitude modulation signal 510 can further be characterized by a pulse width 513, and a target phase 514 of and phase offset 515 relative to the second signal, any of which may or may not vary in time. For instance, regarding a target phase, amplitude modulation of the first signal 501 can synchronize with the negative cycle of the second signal 502, i.e., 3π/2 in FIG. 5A, during the expansion of the plasma sheath. The initiation of the amplitude modulation can precede the target phase 514, as prescribed by the phase offset 515. Together with the pulse width 513, the amplitude modulation can capture the target phase 514, and occupy a portion of the phase of the second signal 502.

Figure 6A:
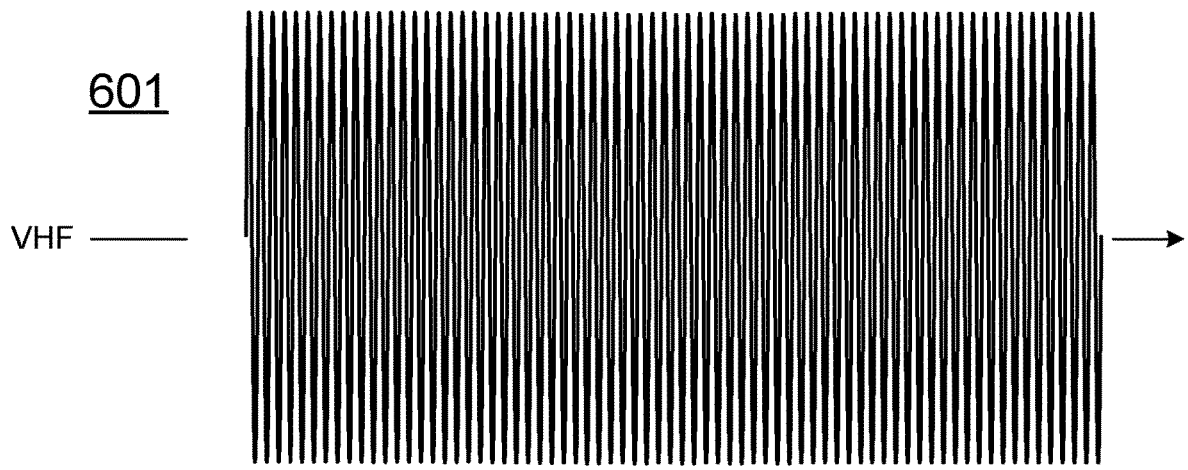
FIGS. 6A and 6B illustrate a method for plasma processing according to an embodiment.
Figure 6A:
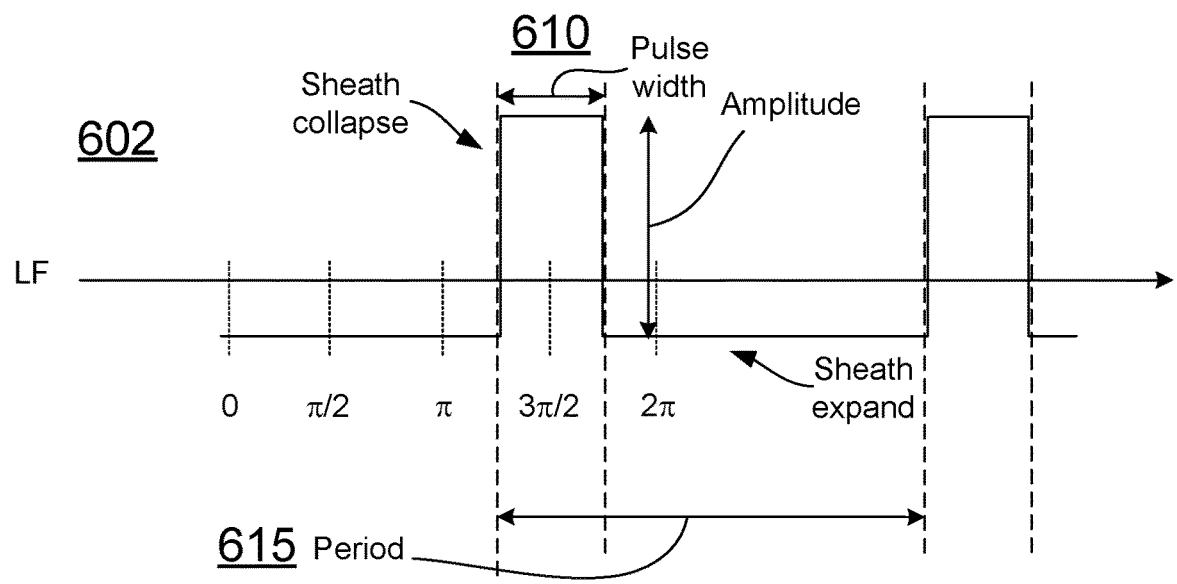
Figure 6B:
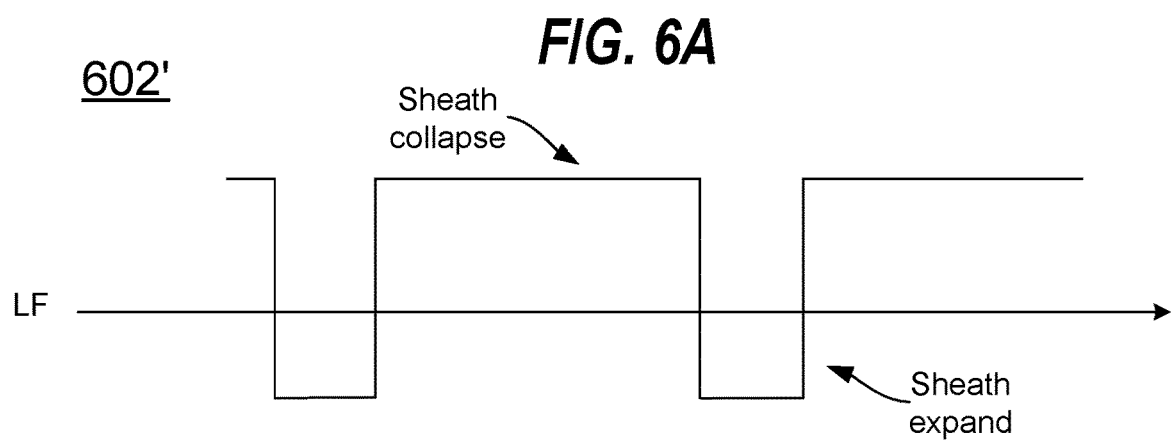

In an alternative embodiment, the low frequency RF (LF) waveform can be designed to tailor a specific sheath configuration, and define the duration for efficient coupling of the high frequency RF (VHF). In this embodiment, the duty cycle of the low frequency RF is adjusted. For example, as shown in FIG. 6A, a first signal 601 at a first frequency (e.g., VHF) and a second signal 602 at a second frequency (e.g., LF) are coupled to a plasma, and the duty cycle of the second signal 602 is adjusted to increase or decrease the duration for plasma sheath expansion, and thus, the VHF coupling efficiency. The duty cycle (%) equals the ratio of the pulse width 610 to the signal period 615. FIG. 6A illustrates a duty cycle that is less than 50%. FIG. 6B illustrates a duty cycle that is greater than 50%.

An understanding of the underlying physical processes, as determined by the inventors, also provides a system and method to monitor and control the effectiveness for modifying plasma properties. As discussed above, reproducibility can be challenging with hardware and process on semiconductor equipment. Equipment drift and matching are examples of the reproducibility challenge. To provide reproducible results, it is important to have a signal which can be monitored and exploited to control equipment hardware and process. As illustrated in FIGS. 2, 3, and 4, high frequency transient behavior can be detected within the plasma, e.g., at the plasma edge, and the amplitude and phase relation to the low frequency waveform can be used as a control diagnostic. The control diagnostic can then either be used to modify the shape of the low frequency waveform keeping the high frequency envelope constant, or modifying the envelope of the high frequency while keeping the low frequency waveform constant, or both simultaneously.

The inventors have determined that adjusting the relative time duration for coupling high frequency signal content (e.g., VHF) during a low voltage state of the low frequency signal content (e.g., LF) versus a high voltage state of the low frequency signal content allows for adjusting the plasma state, including the center-to-edge spatial plasma distribution (e.g., plasma density, ion, or electron, or both). For example, increasing the relative time duration for coupling the high frequency signal content during a low voltage state (i.e., during plasma sheath expansion) increases the plasma density at the edge and decreases plasma density at the center. Additionally, for example, synchronizing the pulsing or modulation of the high frequency signal content at, near, or encompassing at least in part the time duration during a low voltage state for the low frequency signal content promotes an increase of the plasma density at the edge relative to the plasma density at the center, and/or similarly, a decrease of the plasma density at the center relative to the plasma density at the edge. Alternatively, decreasing the relative time duration for coupling the high frequency signal content during a low voltage state (i.e., during plasma sheath expansion) increases the plasma density at the center. Additionally, for example, synchronizing the pulsing or modulation of the high frequency signal content at, near, or encompassing at least in part the time duration during a high voltage state for the low frequency signal content promotes a decrease of the plasma density at the edge relative to the plasma density at the center, and/or similarly, an increase of the plasma density at the center relative to the plasma density at the edge. Via signal modulation, as described herein, the inventors have established systems and methods for modulating plasma properties, including modulation of the spatial distribution of said properties.

According to various embodiments, FIG. 7 provides a schematic illustration of a system 700 for plasma processing. System 700 includes a substrate holder 701 disposed therein, and arranged to support a substrate 702. System 700 further includes a first signal generator 710 for coupling a first signal at a first frequency to plasma in the plasma processing system, and a second signal generator 720 for coupling a second signal at a second frequency to plasma in the plasma processing system, the second frequency being less than the first frequency. In one embodiment, the first frequency exceeds 10 MHz, and the second frequency is less than 15 MHz. Alternatively, the first frequency exceeds 50 MHz, and the second frequency is less than 15 MHz. Alternatively, the first frequency ranges from 50 to 150 MHz, and the second frequency ranges from 1 MHz to 15 MHz. Alternatively, the first frequency exceeds 50 MHz, and the second frequency is less than 5 MHz. Alternatively, the first frequency ranges from 50 to 150 MHz, and the second frequency ranges from 1 MHz to 5 MHz. Alternatively yet, the first frequency ranges from 50 to 150 MHz, and the second frequency ranges from 0.1 MHz to 5 MHz.

A signal modulation controller 730 is coupled to the first signal generator 710 and the second signal generator 720, and configured to control a duration of optimal coupling of the first signal to the plasma to achieve a target spatial distribution of the plasma. According to one embodiment, the signal modulation controller 730 includes an amplitude modulation circuit for modulating the first signal between a high amplitude state and a low amplitude state in response to an amplitude modulation signal, and a timing circuit configured to define the amplitude modulation signal that synchronizes the amplitude modulation of the first signal with a target phase for each cycle of the second signal. As an example, the high amplitude state can be a power-on state, and the low amplitude state can be a power-off state.

Figure 5B:
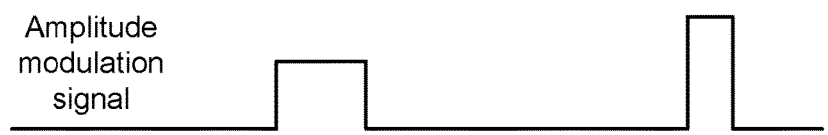

As illustrated in FIG. 5A, the timing circuit defines an amplitude modulation signal synchronized with the target phase of the second signal, the amplitude modulation signal including a pulse width, a pulse amplitude, a pulse offset, a pulse duty cycle, and a pulse waveform shape. The amplitude modulation signal can be periodic or aperiodic (see FIG. 5B, e.g.). Also, as shown in FIGS. 5A and 5B, the amplitude modulation signal includes variations in at least one of the pulse width, the pulse amplitude, the pulse duty cycle, and the pulse waveform shape.

According to another embodiment, the signal modulation controller 730 includes a waveform generator coupled to the second signal generator 720, and configured to adjust a waveform of the second signal and a duty cycle thereof, and control a duration for optimal coupling of the first signal to the plasma. As illustrated in FIG. 6A, the waveform generator can alter the duty cycle of the waveform from a value less than 50% (FIG. 6A) to a value greater than 50% (FIG. 6B). For the condition depicted in FIG. 6A, for example, decreasing the duty cycle of the low frequency signal content during the application of the high frequency signal content promotes an increase of the plasma density at the edge relative to the plasma density at the center, and/or similarly, a decrease of the plasma density at the center relative to the plasma density at the edge. For the condition depicted in FIG. 6B, for example, increasing the duty cycle of the low frequency signal content during the application of the high frequency signal content promotes a decrease of the plasma density at the edge relative to the plasma density at the center, and/or similarly, an increase of the plasma density at the center relative to the plasma density at the edge. The waveform generator can create a signal of any form, including a sinusoid, a square wave, a saw-tooth, etc. The sinusoid can include a mixture of harmonic content to tailor the shape of the waveform.

Referring again to FIG. 7, system 700 can include a controller 740 configured to receive data relating to a spatial distribution of a plasma property across the substrate 702, and instruct the signal modulation controller, e.g., the timing circuit to adjust the amplitude modulation signal, or the waveform generator to adjust the waveform, to achieve a target spatial distribution. Furthermore, system 700 can include a metrology system (not shown) configured to measure data related to the spatial distribution of the plasma property, or an in-situ diagnostic 750 coupled to the plasma processing system, and configured to measure data related to the spatial distribution of the plasma property.

The in-situ diagnostic 750 coupled to the plasma processing system may be configured to measure data related to the spatial distribution of the plasma property. The in-situ diagnostic 750 may include a first voltage probe to record a first plasma signal relating to the first signal. The in-situ diagnostic may further include a second voltage probe to record a second plasma signal relating to the second signal. The in-situ diagnostic 750 may include an antenna to measure the time-varying magnetic field at a location in the plasma.

The power coupling circuit for the first and second signals can include circuitry to modulate signal amplitude (e.g., power amplifier), shift phase, and/or shift frequency (e.g., 'AMP' in FIG. 7). Additionally, the power coupling circuit can include impedance match network(s) (e.g., 'MN' in FIG. 7) having variable electrical components, capacitors and/or inductors, arranged and designed to match the output impedance of the signal generators to the plasma processing circuit, including plasma.

Figure 8:
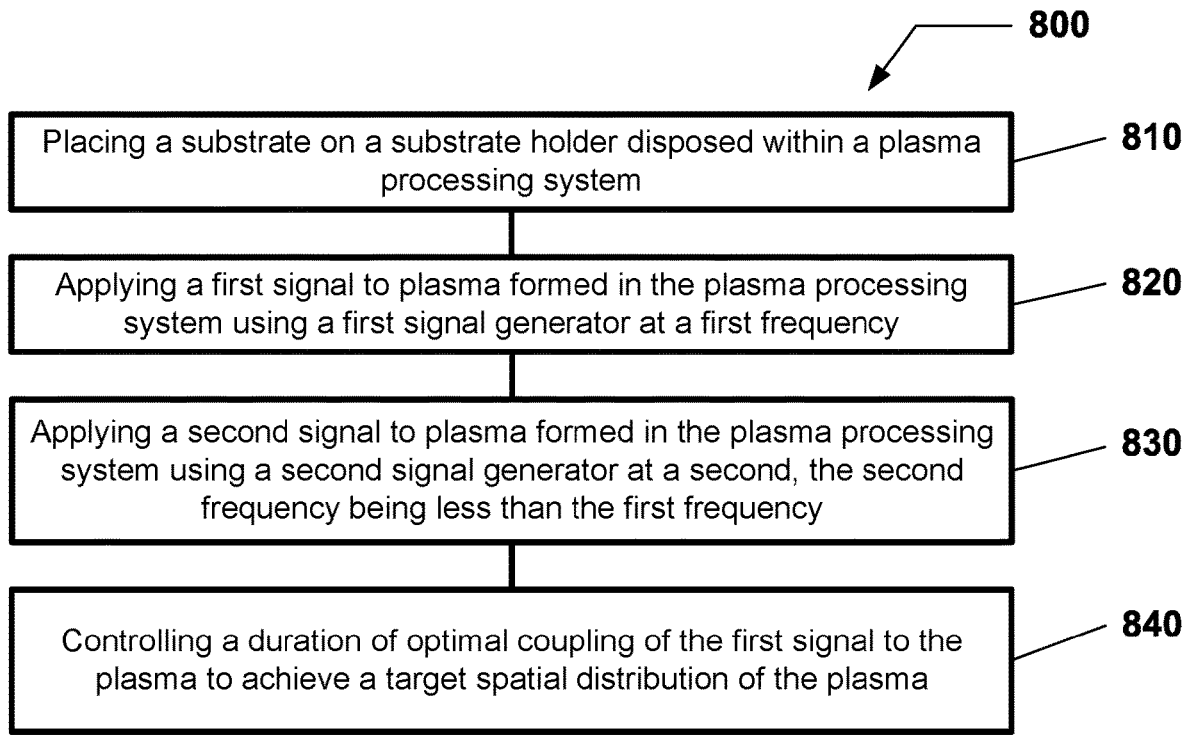
FIG. 8 provides a flow chart illustrating a method of plasma processing according to an embodiment.

According to several embodiments, FIG. 8 illustrates a method of plasma processing. The method, depicted as flow chart 800, includes placing a substrate on a substrate holder disposed within a plasma processing system, in 810; applying a first signal to plasma formed in the plasma processing system using a first signal generator at a first frequency, in 820; and applying a second signal to plasma formed in the plasma processing system using a second signal generator at a second, the second frequency being less than the first frequency, 830.

The method further includes, in 840, controlling a duration of optimal coupling of the first signal to the plasma to achieve a target spatial distribution of the plasma. In one embodiment, when controlling a duration of optimal coupling, signal modulation can include: using an amplitude modulation circuit to modulate the first signal between a high amplitude state and a low amplitude state in response to an amplitude modulation signal, and defining the amplitude modulation signal using a timing circuit configured to synchronize the amplitude modulation of the first signal with a target phase for each cycle of the second signal to control a duration for optimal coupling of the first signal to the plasma. In another embodiment, when controlling a duration of optimal coupling, signal modulation can include: using a waveform generator to modulate a waveform of the second signal and a duty cycle thereof, and control a duration for optimal coupling of the first signal to the plasma. The method can further include sensing a state of the plasma, and altering the signal modulation in accordance with the sensed plasma state.

Figure 9A:
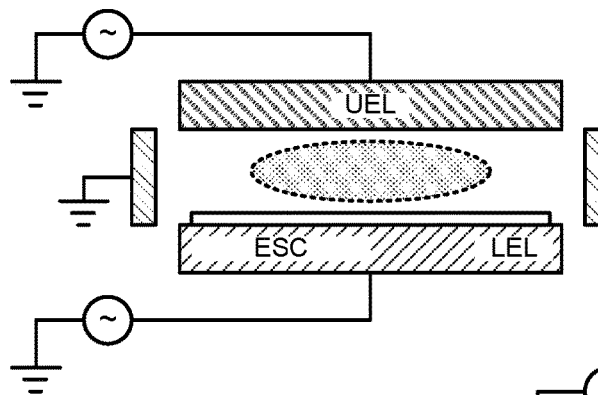
FIGS. 9A through 9D provide schematic illustrations of plasma processing systems for performing the method of etching or deposition according to various embodiments.

FIGS. 9A through 9D provide several plasma generating systems that may be used to facilitate plasma processing incorporating embodiments described above. FIG. 9A illustrates a capacitively coupled plasma (CCP) system, wherein plasma is formed proximate a substrate between an upper plate electrode (UEL) and a lower plate electrode (LEL), the lower electrode also serving as an electrostatic chuck (ESC) to support and retain the substrate. Plasma is formed by coupling radio frequency (RF) power to at least one of the electrodes. As shown in FIG. 9A, RF power is coupled to both the upper and lower electrodes, and the power coupling may include differing RF frequencies. Alternatively, multiple RF power sources may be coupled to the same electrode. Moreover, direct current (DC) power may be coupled to the upper electrode and/or lower electrode.

Figure 9B:
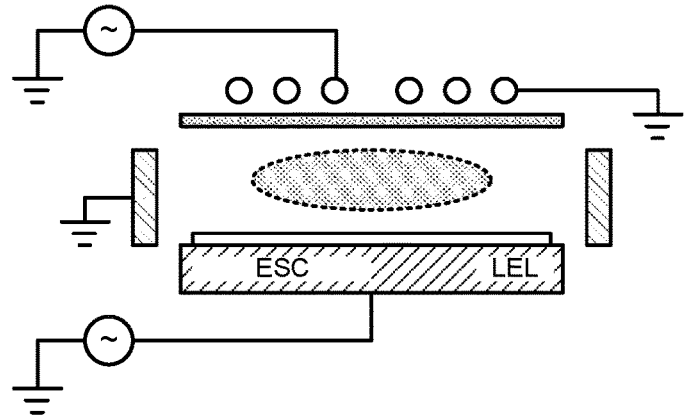

FIG. 9B illustrates an inductively coupled plasma (ICP) system, wherein plasma is formed proximate a substrate between an inductive element (e.g., a planar, or solenoidal/helical coil) and a lower plate electrode (LEL), the lower electrode also serving as an electrostatic chuck (ESC) to support and retain the substrate. Plasma is formed by coupling radio frequency (RF) power to the inductive coupling element. As shown in FIG. 9B, RF power is coupled to both the inductive element and lower electrode, and the power coupling may include differing RF frequencies.

Figure 9C:
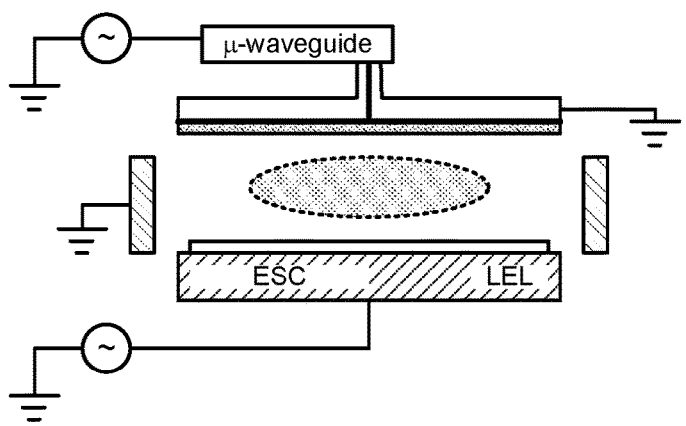

FIG. 9C illustrates a surface wave plasma (SWP) system, wherein plasma is formed proximate a substrate between a slotted plane antenna and a lower plate electrode (LEL), the lower electrode also serving as an electrostatic chuck (ESC) to support and retain the substrate. Plasma is formed by coupling radio frequency (RF) power at microwave frequencies through a waveguide and coaxial line to the slotted plane antenna. As shown in FIG. 9C, RF power is coupled to both the slotted plane antenna and lower electrode, and the power coupling may include differing RF frequencies.

Figure 9D:
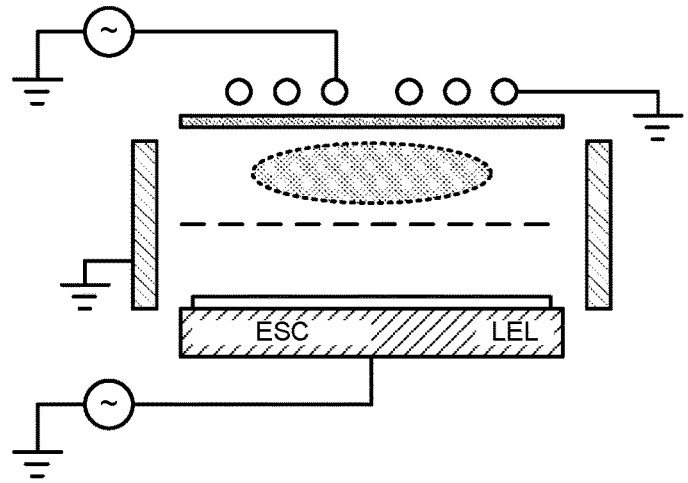

FIG. 9D illustrates remote plasma system, wherein plasma is formed in a region remote from a substrate and separated from the substrate by a filter arranged to impede the transport of charged particles from the remote plasma source to a processing region proximate the substrate. The substrate is supported by a lower plate electrode (LEL) that also serves as an electrostatic chuck (ESC) to retain the substrate. Plasma is formed by coupling radio frequency (RF) power to a plasma generating device adjacent the remotely located region. As shown in FIG. 9D, RF power is coupled to both the plasma generating device adjacent the remote region and lower electrode, and the power coupling may include differing RF frequencies.

The plasma processing systems of FIGS. 9A through 9D are intended to be illustrative of various techniques for implementing etching and/or depositing (film-forming) processes described. Other embodiments are contemplated including both combinations and variations of the systems described.

In the claims below, any of the dependents limitations can depend from any of the independent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A system for using plasma to treat a substrate, comprising:
    a substrate holder disposed within a plasma processing system, and arranged to support a substrate;
    a first signal generator for coupling a first signal at a first frequency to plasma in the plasma processing system, the plasma comprising a plasma sheath;
    a second signal generator for coupling a second signal at a second frequency to the plasma in the plasma processing system, the second frequency being less than the first frequency, wherein the second signal is a low frequency (LF) sinusoidal waveform having the second frequency;
    a timing circuit configured to define an amplitude modulation signal as comprising a series of pulses each synchronized with a corresponding negative cycle of the LF sinusoidal waveform during expansion of the plasma sheath, wherein a pulse width of each of the series of pulses comprises a duration less than half of the period of the second frequency of the LF sinusoidal waveform; and
    an amplitude modulation circuit for modulating the first signal between a high amplitude state and a low amplitude state in response to the amplitude modulation signal, the first signal being in the high amplitude state during negative cycles of the LF sinusoidal waveform.

2. The system of claim 1, wherein the first frequency exceeds 50 MHz, and the second frequency is less than 5 MHz.

3. The system of claim 1, wherein the high amplitude state is a power-on state, and the low amplitude state is a power-off state.

4. The system of claim 1, wherein the amplitude modulation signal is periodic or aperiodic.

5. The system of claim 1, wherein the amplitude modulation signal includes variations in at least one of the pulse widths of the series of pulses, pulse amplitudes of the series of pulses, a pulse duty cycle of the amplitude modulation signal, and a pulse waveform shape of the amplitude modulation signal.

6. The system of claim 1, further comprising:
    an in-situ diagnostic coupled to the plasma processing system, and configured to measure data related to a spatial and temporal distribution of a plasma property.

7. The system of claim 1, wherein the first signal and the second signal are coupled to the substrate holder.

8. The system of claim 1, wherein the first signal is coupled to an electrode opposing the substrate holder, and the second signal is coupled to the substrate holder.

9. A method for plasma processing, comprising:
    placing a substrate on a substrate holder disposed within a plasma processing system;
    applying a first signal to plasma formed in the plasma processing system using a first signal generator at a first frequency, the plasma comprising a plasma sheath;
    applying a second signal to the plasma formed in the plasma processing system using a second signal generator at a second frequency, the second frequency being less than the first frequency, wherein the second signal is a low frequency (LF) sinusoidal waveform having the second frequency; and
    controlling a duration of optimal coupling of the first signal to the plasma to achieve a target spatial distribution of the plasma by modulating the first signal using an amplitude modulation signal comprising a series of pulses, each synchronized with a corresponding negative cycle of the LF sinusoidal waveform during expansion of the plasma sheath and each with a pulse width comprising a duration less than half of the period of the second frequency of the LF sinusoidal waveform.

10. The method of claim 9, wherein the controlling comprises:
using a timing circuit configured to synchronize the modulation of the first signal with a corresponding target phase of a corresponding cycle of the second signal.

11. The method of claim 9, further comprising:
sensing a state of the plasma; and
altering the signal modulation in accordance with the sensed plasma state.

12. A system for using plasma to treat a substrate, comprising:
a substrate holder disposed within a plasma processing system, and arranged to support a substrate;
a first signal generator for coupling a first signal at a first frequency to plasma in the plasma processing system, the plasma comprising a plasma sheath;
a second signal generator for coupling a second signal at a second frequency to the plasma in the plasma processing system, the second frequency being less than the first frequency, wherein the second signal is a low frequency (LF) sinusoidal waveform having the second frequency;
a timing circuit configured to define an amplitude modulation signal as comprising a series of pulses each synchronized with a corresponding negative cycle of the LF sinusoidal waveform during expansion of the plasma sheath, wherein a pulse width of each of the series of pulses comprises a duration less than half of the period of the second frequency of the LF sinusoidal waveform;
an amplitude modulation circuit for modulating the first signal between a high amplitude state and a low amplitude state in response to the amplitude modulation signal, the first signal being in the high amplitude state during negative cycles of the LF sinusoidal waveform; and
a controller configured to receive data relating to a spatial and temporal distribution of a plasma property across the substrate, and instruct the timing circuit to adjust the amplitude modulation signal to achieve a target spatial distribution.

13. The system of claim 12, wherein the first frequency exceeds 50 MHz, and the second frequency is less than 5 MHz.

14. The system of claim 12, wherein the amplitude modulation signal includes variations in at least one of the pulse widths of the series of pulses, pulse amplitudes of the series of pulses, a pulse duty cycle of the amplitude modulation signal, and a pulse waveform shape of the amplitude modulation signal.

15. The system of claim 12, further comprising:
an in-situ diagnostic coupled to the plasma processing system, and configured to measure data related to the spatial and temporal distribution of the plasma property.

16. The system of claim 12, wherein the amplitude modulation signal is periodic.

17. The system of claim 12, wherein the amplitude modulation signal is aperiodic.

18. The method of claim 9, wherein the controlling comprises:
using an in-situ diagnostic coupled to the plasma processing system to measure data related to a spatial and temporal distribution of the plasma property.

19. The method of claim 9, wherein the amplitude modulation signal is periodic.

20. The method of claim 9, wherein the amplitude modulation signal is aperiodic.

* * * * *